United States Patent
Rofougaran et al.

(10) Patent No.: US 8,666,335 B2
(45) Date of Patent: *Mar. 4, 2014

(54) WIRELESS DEVICE WITH N-PHASE TRANSMITTER

(71) Applicant: Broadcom Corporation, Irvine, CA (US)

(72) Inventors: Ahmadreza Rofougaran, Newport Coast, CA (US); Maryam Rofougaran, Rancho Palos Verdes, CA (US)

(73) Assignee: Broadcom Corporation, Irvine, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/655,868

(22) Filed: Oct. 19, 2012

(65) Prior Publication Data

US 2013/0072138 A1    Mar. 21, 2013

Related U.S. Application Data

(63) Continuation of application No. 12/650,246, filed on Dec. 30, 2009, now Pat. No. 8,295,788.

(60) Provisional application No. 61/246,618, filed on Sep. 29, 2009, provisional application No. 61/185,245, filed on Jun. 9, 2009.

(51) Int. Cl.
*H04B 1/04* (2006.01)

(52) U.S. Cl.
USPC ............ 455/110; 455/129; 375/308; 343/829

(58) Field of Classification Search
USPC .................. 455/110, 113, 118, 129; 375/308; 343/767, 770, 829
See application file for complete search history.

(56) References Cited

U.S. PATENT DOCUMENTS

| | | | |
|---|---|---|---|
| 3,972,049 A | 7/1976 | Kaloi | |
| 4,078,237 A | 3/1978 | Kaloi | |
| 4,701,763 A | 10/1987 | Yamamoto et al. | |
| 5,138,436 A | 8/1992 | Koepf | |
| 5,300,875 A | 4/1994 | Tuttle | |

(Continued)

OTHER PUBLICATIONS

Iyer et al., "Wireless chip to chip interconnections for multichip modules using leaky wave antennas", Nov. 1993, pp. 2030-2031.
Huang et al., "An Electronically Switchable Leaky Wave Antenna", Nov. 2000, pp. 1769-1772.
Grbic et al., "Leaky CPW-Based Slot Antenna Arrays for Millimeter-Wave Applications", Nov. 2002, pp. 1494-1504.
Floyd et al., "Wireless Interconnects for Clock Distribution", pp. 105-108, Dec. 2002.
Zvolensky et al., "Leaky-Wave antenna based on micro-electromechanical systems-loaded microstrip line", 2011, pp. 357-363.

(Continued)

*Primary Examiner* — Nhan Le
(74) *Attorney, Agent, or Firm* — Farjami & Farjami LLP

(57) ABSTRACT

Methods and systems for an n-phase transmitter utilizing a leaky wave antenna (LWA) are disclosed and may include transmitting an n-phase wireless signal at a first frequency via the LWA utilizing a plurality of second frequency signals from one or more signal sources, and the second frequency may be lower than the first frequency. Each of the second frequency signals may be configured with a phase difference and may be communicated to the LWA utilizing one or more power amplifiers (PAs). The PAs may be operated in switching mode, thereby generating a square wave. The LWAs may be integrated on the chip, on a package to which the chip is affixed, and/or on a printed circuit board to which the chip is affixed. Square wave signals may be generated utilizing the signal sources. The transmitted wireless signal may be amplitude modulated utilizing a bias voltage applied to the LWAs.

20 Claims, 8 Drawing Sheets

(56) References Cited

U.S. PATENT DOCUMENTS

| | | | |
|---|---|---|---|
| 5,363,075 A | 11/1994 | Fanucchi | |
| 5,387,885 A | 2/1995 | Chi | |
| 5,717,943 A | 2/1998 | Barker | |
| 5,812,933 A | 9/1998 | Niki | |
| 5,900,843 A | 5/1999 | Lee | |
| 5,912,598 A | 6/1999 | Stones | |
| 5,943,025 A | 8/1999 | Benham | |
| 6,005,520 A | 12/1999 | Nalbandian | |
| 6,037,743 A | 3/2000 | White | |
| 6,127,799 A | 10/2000 | Krishnan | |
| 6,285,325 B1 | 9/2001 | Nalbandian | |
| 6,317,095 B1 | 11/2001 | Teshirogi | |
| 6,339,402 B1 | 1/2002 | McKivergan | |
| 6,380,883 B1 | 4/2002 | Bell | |
| 6,404,390 B2 | 6/2002 | Sheen | |
| 6,411,824 B1 | 6/2002 | Eidson | |
| 6,597,323 B2 | 7/2003 | Teshirogi et al. | |
| 6,603,915 B2 | 8/2003 | Glebov | |
| 6,735,630 B1 | 5/2004 | Gelvin | |
| 6,771,935 B1 | 8/2004 | Leggett | |
| 6,841,981 B2 | 1/2005 | Smith | |
| 6,954,236 B1 | 10/2005 | Russell | |
| 7,002,517 B2 | 2/2006 | Noujeim | |
| 7,020,701 B1 | 3/2006 | Gelvin | |
| 7,023,374 B2 | 4/2006 | Jossef | |
| 7,233,299 B2 | 6/2007 | Thevenot | |
| 7,242,368 B2 | 7/2007 | Thevenot | |
| 7,253,780 B2 | 8/2007 | Sievenpiper | |
| 7,268,517 B2 | 9/2007 | Rahmel | |
| 7,271,680 B2 | 9/2007 | Hall | |
| 7,317,342 B2 | 1/2008 | Saint-Laurent | |
| 7,330,090 B2 | 2/2008 | Itoh | |
| 7,348,928 B2 | 3/2008 | Ma | |
| 7,373,133 B2 | 5/2008 | Mickle | |
| 7,388,557 B2 | 6/2008 | Jecko | |
| 7,394,288 B1 | 7/2008 | Agarwal | |
| 7,411,564 B2 | 8/2008 | Thevenot | |
| 7,535,958 B2 | 5/2009 | Best | |
| 7,592,957 B2 | 9/2009 | Achour | |
| 7,620,424 B2 | 11/2009 | Cetiner | |
| 7,733,265 B2 | 6/2010 | Margomenos | |
| 7,830,220 B2 | 11/2010 | Ceylan | |
| 7,855,696 B2 | 12/2010 | Gummalla | |
| 7,982,681 B2 | 7/2011 | Chang | |
| 8,019,293 B2 | 9/2011 | Dagher | |
| 8,195,103 B2 | 6/2012 | Waheed | |
| 8,242,957 B2 | 8/2012 | Rofougaran | |
| 8,285,231 B2 | 10/2012 | Rofougaran | |
| 8,295,788 B2* | 10/2012 | Rofougaran et al. | 455/110 |
| 8,299,971 B2 | 10/2012 | Talty et al. | |
| 8,457,581 B2 | 6/2013 | Rofougaran | |
| 8,508,422 B2 | 8/2013 | Rofougaran | |
| 2002/0000936 A1 | 1/2002 | Sheen | |
| 2002/0005807 A1* | 1/2002 | Sheen | 343/7 MS |
| 2002/0041256 A1 | 4/2002 | Saitou et al. | |
| 2002/0135568 A1 | 9/2002 | Chen | |
| 2003/0122729 A1 | 7/2003 | Diaz et al. | |
| 2004/0066251 A1 | 4/2004 | Eleftheriades | |
| 2004/0203944 A1 | 10/2004 | Huomo | |
| 2004/0227668 A1 | 11/2004 | Sievenpiper | |
| 2004/0263378 A1 | 12/2004 | Jossef | |
| 2004/0263408 A1 | 12/2004 | Sievenpiper | |
| 2005/0012667 A1 | 1/2005 | Noujeim | |
| 2005/0052283 A1 | 3/2005 | Collins | |
| 2005/0052424 A1 | 3/2005 | Shih | |
| 2005/0116864 A1 | 6/2005 | Mohamadi | |
| 2005/0128155 A1 | 6/2005 | Fukuda | |
| 2005/0130700 A1 | 6/2005 | Gardenfors | |
| 2005/0134579 A1 | 6/2005 | Hsieh | |
| 2005/0136972 A1 | 6/2005 | Smith | |
| 2006/0066326 A1 | 3/2006 | Slupsky | |
| 2006/0109127 A1 | 5/2006 | Barink | |
| 2006/0125703 A1 | 6/2006 | Ma | |
| 2006/0125713 A1 | 6/2006 | Thevenot | |
| 2006/0281423 A1 | 12/2006 | Caimi | |
| 2007/0171076 A1 | 7/2007 | Stevens | |
| 2007/0190952 A1 | 8/2007 | Waheed | |
| 2007/0273607 A1 | 11/2007 | Chen | |
| 2007/0285248 A1 | 12/2007 | Hamel | |
| 2007/0287403 A1* | 12/2007 | Sjoland | 455/326 |
| 2008/0068174 A1 | 3/2008 | Al-Mahdawi | |
| 2008/0105966 A1 | 5/2008 | Beer | |
| 2008/0159243 A1 | 7/2008 | Rofougaran | |
| 2008/0231603 A1 | 9/2008 | Parkinson | |
| 2008/0258981 A1 | 10/2008 | Achour | |
| 2008/0278400 A1 | 11/2008 | Lohninger et al. | |
| 2008/0284085 A1 | 11/2008 | Curina | |
| 2009/0066516 A1 | 3/2009 | Lazo | |
| 2009/0251362 A1 | 10/2009 | Margomenos | |
| 2010/0110943 A2 | 5/2010 | Gummalla | |
| 2010/0176880 A2 | 7/2010 | Dupuy | |
| 2010/0222105 A1 | 9/2010 | Nghiem | |
| 2010/0308668 A1 | 12/2010 | Rofougaran | |
| 2010/0308767 A1 | 12/2010 | Rofougaran | |
| 2010/0308885 A1 | 12/2010 | Rofougaran | |
| 2010/0308970 A1 | 12/2010 | Rofougaran | |
| 2010/0308997 A1 | 12/2010 | Rofougaran | |
| 2010/0309040 A1 | 12/2010 | Rofougaran | |
| 2010/0309056 A1 | 12/2010 | Rofougaran | |
| 2010/0309069 A1 | 12/2010 | Rofougaran | |
| 2010/0309071 A1 | 12/2010 | Rofougaran | |
| 2010/0309072 A1 | 12/2010 | Rofougaran | |
| 2010/0309073 A1 | 12/2010 | Rofougaran | |
| 2010/0309074 A1 | 12/2010 | Rofougaran | |
| 2010/0309075 A1 | 12/2010 | Rofougaran | |
| 2010/0309076 A1 | 12/2010 | Rofougaran | |
| 2010/0309077 A1 | 12/2010 | Rofougaran | |
| 2010/0309078 A1 | 12/2010 | Rofougaran | |
| 2010/0309079 A1 | 12/2010 | Rofougaran | |
| 2010/0309824 A1 | 12/2010 | Rofougaran | |
| 2010/0311324 A1 | 12/2010 | Rofougaran | |
| 2010/0311332 A1 | 12/2010 | Rofougaran | |
| 2010/0311333 A1 | 12/2010 | Rofougaran | |
| 2010/0311338 A1 | 12/2010 | Rofougaran | |
| 2010/0311340 A1 | 12/2010 | Rofougaran | |
| 2010/0311355 A1 | 12/2010 | Rofougaran | |
| 2010/0311356 A1 | 12/2010 | Rofougaran | |
| 2010/0311359 A1 | 12/2010 | Rofougaran | |
| 2010/0311363 A1 | 12/2010 | Rofougaran | |
| 2010/0311364 A1 | 12/2010 | Rofougaran | |
| 2010/0311367 A1 | 12/2010 | Rofougaran | |
| 2010/0311368 A1 | 12/2010 | Rofougaran | |
| 2010/0311369 A1 | 12/2010 | Rofougaran | |
| 2010/0311376 A1 | 12/2010 | Rofougaran | |
| 2010/0311379 A1 | 12/2010 | Rofougaran | |
| 2010/0311380 A1 | 12/2010 | Rofougaran | |
| 2010/0311472 A1 | 12/2010 | Rofougaran | |
| 2010/0311493 A1 | 12/2010 | Miller | |
| 2011/0148723 A1 | 6/2011 | Bengtsson | |
| 2011/0163930 A1 | 7/2011 | De Lustrac | |
| 2012/0095531 A1 | 4/2012 | Derbas et al. | |
| 2012/0153731 A9 | 6/2012 | Kirby et al. | |
| 2012/0263256 A1 | 10/2012 | Waheed | |

OTHER PUBLICATIONS

O, K.K. et al., "Silicon Integrated Circuits Incorporating Antennas", IEEE Custom Integrated Circuits Conference, 2006, pp. 473-480.

Sterner et al., "RF MEMS High-Impedance Tuneable Metamaterials for Millimeter-Wave Beam Steering", Micro Electro Mechanical Systems, 2009, pp. 896-899.

Ourir et al., "Electronically Reconfigurable Metamaterial for Compact Directive Cavity Antennas", Electronics Letters, 2007.

Kimoto et al., "On-Chip Wireless Signal Transmission using Silicon Integrated Antennas", Measurement 40, No. 30, (2004): 20.

Feresidis et al., "Flat Plate Millimetre Wave Antenna Based on Partially Reflective FSS", 11th International Conference on Antennas and Propagation, 2001, pp. 33-36.

Yeo et al., "Novel Design of a High-Gain and Wideband Fabry-Perot Cavity Antenna Using a Tapered AMC Substrate", J Infrared Milli Terahz Waves, (2009) vol. 30, pp. 217-224.

* cited by examiner

WIRELESS DEVICE WITH N-PHASE TRANSMITTER

This is a continuation of application Ser. No. 12/650,246 filed Dec. 30, 2009.

CROSS-REFERENCE TO RELATED APPLICATIONS/INCORPORATION BY REFERENCE

This application makes reference to, claims the benefit from, and claims priority to U.S. Provisional Application Ser. No. 61/246,618 filed on Sep. 29, 2009, and U.S. Provisional Application Ser. No. 61/185,245 filed on Jun. 9, 2009.

This application also makes reference to:
U.S. patent application Ser. No. 12/650,212 filed on Dec. 30, 2009;
U.S. patent application Ser. No. 12/650,295 filed on Dec. 30, 2009;
U.S. patent application Ser. No. 12/650,277 filed on Dec. 30, 2009;
U.S. patent application Ser. No. 12/650,192 filed on Dec. 30, 2009;
U.S. patent application Ser. No. 12/650,224 filed on Dec. 30, 2009;
U.S. patent application Ser. No. 12/650,176 filed on Dec. 30, 2009;
U.S. patent application Ser. No. 12/650,292 filed on Dec. 30, 2009; and
U.S. patent application Ser. No. 12/650,324 filed on Dec. 30, 2009.

Each of the above stated applications is hereby incorporated herein by reference in its entirety.

FEDERALLY SPONSORED RESEARCH OR DEVELOPMENT

[Not Applicable]

MICROFICHE/COPYRIGHT REFERENCE

[Not Applicable]

FIELD OF THE INVENTION

Certain embodiments of the invention relate to wireless communication. More specifically, certain embodiments of the invention relate to a method and system for an n-phase transmitter utilizing a leaky wave antenna.

BACKGROUND OF THE INVENTION

Mobile communications have changed the way people communicate and mobile phones have been transformed from a luxury item to an essential part of every day life. The use of mobile phones is today dictated by social situations, rather than hampered by location or technology. While voice connections fulfill the basic need to communicate, and mobile voice connections continue to filter even further into the fabric of every day life, the mobile Internet is the next step in the mobile communication revolution. The mobile Internet is poised to become a common source of everyday information, and easy, versatile mobile access to this data will be taken for granted.

As the number of electronic devices enabled for wireline and/or mobile communications continues to increase, significant efforts exist with regard to making such devices more power efficient. For example, a large percentage of communications devices are mobile wireless devices and thus often operate on battery power. Additionally, transmit and/or receive circuitry within such mobile wireless devices often account for a significant portion of the power consumed within these devices. Moreover, in some conventional communication systems, transmitters and/or receivers are often power inefficient in comparison to other blocks of the portable communication devices. Accordingly, these transmitters and/or receivers have a significant impact on battery life for these mobile wireless devices.

Further limitations and disadvantages of conventional and traditional approaches will become apparent to one of skill in the art, through comparison of such systems with the present invention as set forth in the remainder of the present application with reference to the drawings.

BRIEF SUMMARY OF THE INVENTION

A system and/or method for an n-phase transmitter utilizing a leaky wave antenna, substantially as shown in and/or described in connection with at least one of the figures, as set forth more completely in the claims.

Various advantages, aspects and novel features of the present invention, as well as details of an illustrated embodiment thereof, will be more fully understood from the following description and drawings.

DETAILED DESCRIPTION OF THE INVENTION

Certain aspects of the invention may be found in a method and system for an n-phase transmitter utilizing a leaky wave antenna. Exemplary aspects of the invention may comprise transmitting an n-phase wireless signal at a first frequency via a leaky wave antenna in a wireless device utilizing a plurality of second frequency signals from one or more signal sources, wherein the second frequency may be lower than the first frequency. Each of the plurality of lower frequency signals may be configured with a phase difference to generate the higher frequency signal. The plurality of lower frequency signals may be communicated to the one of the one or more leaky wave antennas utilizing one or more power amplifiers. The one or more power amplifiers may be operated in switching mode. A square wave may be generated from the source signal utilizing the one or more power amplifiers operating in the switching mode. The one or more leaky wave antennas may be integrated on the chip, on a package to which the chip is affixed, and/or on a printed circuit board to which the chip is affixed. A plurality of square wave signals may be generated utilizing the one or more signal sources. The transmitted wireless signal may be amplitude modulated utilizing a bias voltage applied to the one or more leaky wave antennas.

Figure 1:
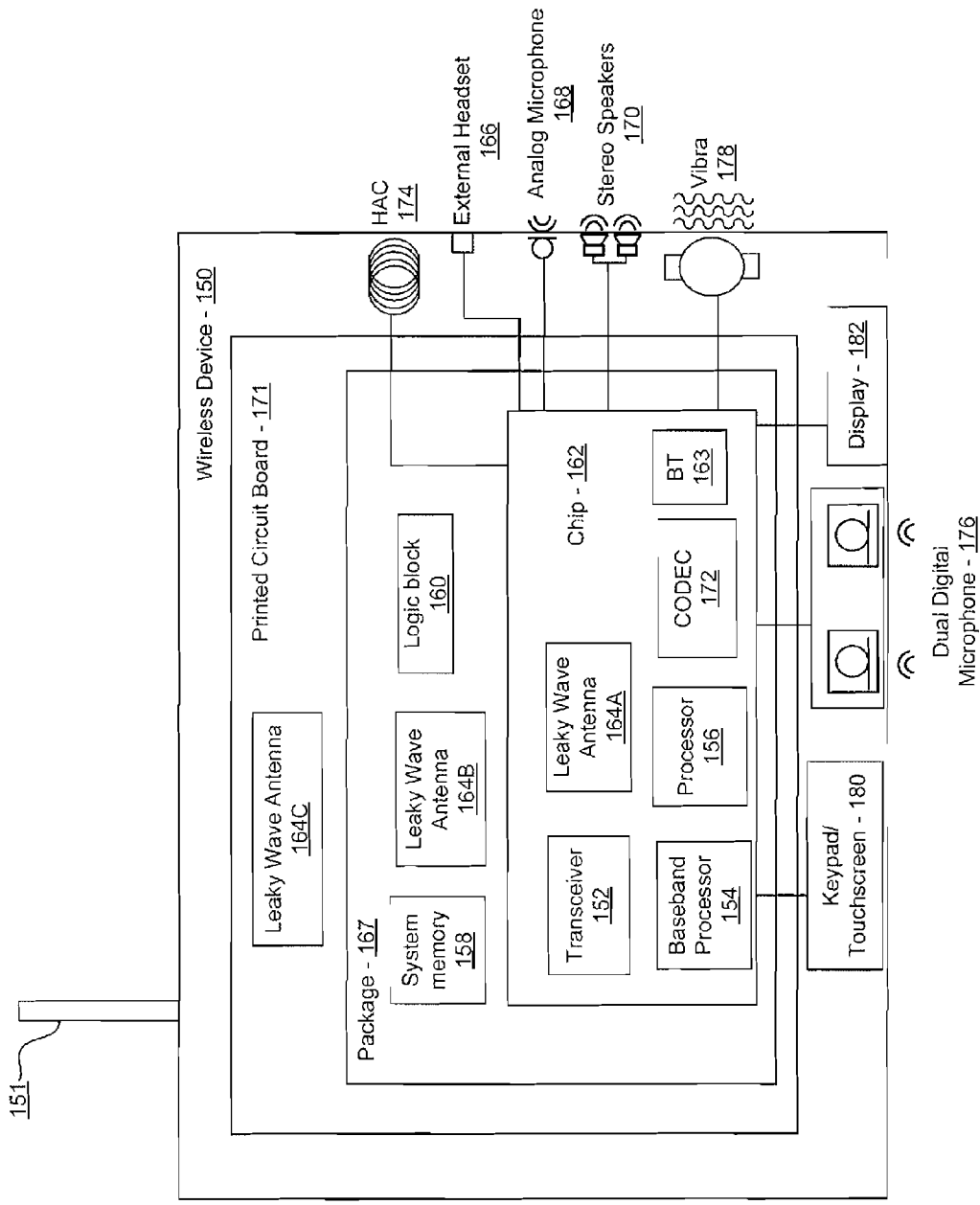
FIG. 1 is a block diagram of an exemplary wireless system with an n-phase transmitter utilizing a leaky wave antenna, which may be utilized in accordance with an embodiment of the invention.

FIG. 1 is a block diagram of an exemplary wireless system with an n-phase transmitter utilizing a leaky wave antenna, which may be utilized in accordance with an embodiment of the invention. Referring to FIG. 1, the wireless device 150 may comprise an antenna 151, a transceiver 152, a baseband processor 154, a processor 156, a system memory 158, a logic block 160, a chip 162, leaky wave antennas 164A, 164B, and 164C an external headset port 166, and a package 167. The wireless device 150 may also comprise an analog microphone 168, integrated hands-free (IHF) stereo speakers 170, a printed circuit board 171, a hearing aid compatible (HAC) coil 174, a dual digital microphone 176, a vibration transducer 178, a keypad and/or touchscreen 180, and a display 182.

The transceiver 152 may comprise suitable logic, circuitry, interface(s), and/or code that may be enabled to modulate and upconvert baseband signals to RF signals for transmission by one or more antennas, which may be represented generically by the antenna 151. The transceiver 152 may also be enabled to downconvert and demodulate received RF signals to baseband signals. The RF signals may be received by one or more antennas, which may be represented generically by the antenna 151, or the leaky wave antennas 164A and 164B. Different wireless systems may use different antennas for transmission and reception. The transceiver 152 may be enabled to execute other functions, for example, filtering the baseband and/or RF signals, and/or amplifying the baseband and/or RF signals. Although a single transceiver 152 is shown, the invention is not so limited. Accordingly, the transceiver 152 may be implemented as a separate transmitter and a separate receiver. In addition, there may be a plurality of transceivers, transmitters and/or receivers. In this regard, the plurality of transceivers, transmitters and/or receivers may enable the wireless device 150 to handle a plurality of wireless protocols and/or standards including cellular, WLAN and PAN. Wireless technologies handled by the wireless device 150 may comprise GSM, CDMA, CDMA2000, WCDMA, GMS, GPRS, EDGE, WIMAX, WLAN, 3GPP, LIMTS, LTE, BLUETOOTH, and Zig Bee, for example.

The baseband processor 154 may comprise suitable logic, circuitry, interface(s), and/or code that may be enabled to process baseband signals for transmission via the transceiver 152 and/or the baseband signals received from the transceiver 152. The processor 156 may be any suitable processor or controller such as a CPU, DSP, ARM, or any type of integrated circuit processor. The processor 156 may comprise suitable logic, circuitry, and/or code that may be enabled to control the operations of the transceiver 152 and/or the baseband processor 154. For example, the processor 156 may be utilized to update and/or modify programmable parameters and/or values in a plurality of components, devices, and/or processing elements in the transceiver 152 and/or the baseband processor 154. At least a portion of the programmable parameters may be stored in the system memory 158.

Control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The system memory 158 may comprise suitable logic, circuitry, interface(s), and/or code that may be enabled to store a plurality of control and/or data information, including parameters needed to calculate frequencies and/or gain, and/or the frequency value and/or gain value. The system memory 158 may store at least a portion of the programmable parameters that may be manipulated by the processor 156.

The logic block 160 may comprise suitable logic, circuitry, interface(s), and/or code that may enable controlling of various functionalities of the wireless device 150. For example, the logic block 160 may comprise one or more state machines that may generate signals to control the transceiver 152 and/or the baseband processor 154. The logic block 160 may also comprise registers that may hold data for controlling, for example, the transceiver 152 and/or the baseband processor 154. The logic block 160 may also generate and/or store status information that may be read by, for example, the processor 156. Amplifier gains and/or filtering characteristics, for example, may be controlled by the logic block 160.

The BT radio/processor 163 may comprise suitable circuitry, logic, interface(s), and/or code that may enable transmission and reception of Bluetooth signals. The BT radio/processor 163 may enable processing and/or handling of BT baseband signals. In this regard, the BT radio/processor 163 may process or handle BT signals received and/or BT signals transmitted via a wireless communication medium. The BT radio/processor 163 may also provide control and/or feedback information to/from the baseband processor 154 and/or the processor 156, based on information from the processed BT signals. The BT radio/processor 163 may communicate information and/or data from the processed BT signals to the processor 156 and/or to the system memory 158. Moreover, the BT radio/processor 163 may receive information from the processor 156 and/or the system memory 158, which may be processed and transmitted via the wireless communication medium a Bluetooth headset, for example The CODEC 172 may comprise suitable circuitry, logic, interface(s), and/or code that may process audio signals received from and/or communicated to input/output devices. The input devices may be within or communicatively coupled to the wireless device 150, and may comprise the analog microphone 168, the stereo speakers 170, the hearing aid compatible (HAC) coil 174, the dual digital microphone 176, and the vibration transducer 178, for example. The CODEC 172 may be operable to up-convert and/or down-convert signal frequencies to desired frequencies for processing and/or transmission via an output device. The CODEC 172 may enable utilizing a plurality of digital audio inputs, such as 16 or 18-bit inputs, for example. The CODEC 172 may also enable utilizing a plurality of data sampling rate inputs. For example, the CODEC 172 may accept digital audio signals at sampling rates such as 8 kHz, 11.025 kHz, 12 kHz, 16 kHz, 22.05 kHz, 24 kHz, 32 kHz, 44.1 kHz, and/or 48 kHz. The CODEC 172 may also support mixing of a plurality of audio sources. For example, the CODEC 172 may support audio sources such as general audio, polyphonic ringer, $I^2S$ FM audio, vibration driving signals, and voice. In this regard, the general audio and polyphonic ringer sources may support the plurality of sampling rates that the audio CODEC 172 is enabled to accept, while the voice source may support a portion of the plurality of sampling rates, such as 8 kHz and 16 kHz, for example.

The chip 162 may comprise an integrated circuit with multiple functional blocks integrated within, such as the transceiver 152, the processor 156, the baseband processor 154, the BT radio/processor 163, the CODEC 172, and the leaky wave antenna 164A. The number of functional blocks integrated in the chip 162 is not limited to the number shown in FIG. 1. Accordingly, any number of blocks may be integrated on the chip 162 depending on chip space and wireless device 150 requirements, for example.

The leaky wave antennas 164A, 164B, and 164C may comprise a resonant cavity with a highly reflective surface and a lower reflectivity surface, and may be integrated in and/or on the chip 162, the package 167, and/or the printed circuit board 171. The lower reflectivity surface may allow the resonant mode to "leak" out of the cavity. The lower reflectivity surface of the leaky wave antennas 164A, 164B, and 164C may be configured with slots in a metal surface, or a pattern of metal patches, as described further in FIGS. 2 and 3. The physical dimensions of the leaky wave antennas 164A, 164B, and 164C may be configured to optimize bandwidth of transmission and/or the beam pattern radiated. In another embodiment of the invention, the leaky wave antenna 164B may be integrated in and/or on the package 167, and the leaky wave antenna 164C may be integrated in and/or on the printed circuit board 171 to which the chip 162 may be affixed. In this manner, the dimensions of the leaky wave antennas 164B and 164C may not be limited by the size of the chip 162.

The resonant cavity of the leaky wave antennas 164A, 164B, and/or 164C may enable the combination of a plurality of signals via a plurality of feed points. In an exemplary embodiment of the invention, each of the plurality of signals communicated to the leaky wave antennas 164A, 164B, and/or 164C may comprise a different phase, such that the resonant cavity of the leaky wave antennas 164A, 164B, and/or 164C may generate a transmitted signal that may be a constructive summation of the multiple signals. In this manner, the leaky wave antennas 164A, 164B, and/or 164C may transmit a signal at a higher frequency by receiving a plurality of signals at a lower frequency, but with appropriate phase difference to generate transitions for a higher frequency signal.

The external headset port 166 may comprise a physical connection for an external headset to be communicatively coupled to the wireless device 150. The analog microphone 168 may comprise suitable circuitry, logic, interface(s), and/or code that may detect sound waves and convert them to electrical signals via a piezoelectric effect, for example. The electrical signals generated by the analog microphone 168 may comprise analog signals that may require analog to digital conversion before processing.

The package 167 may comprise a ceramic package, a printed circuit board, or other support structure for the chip 162 and other components of the wireless device 150. In this regard, the chip 162 may be bonded to the package 167. The package 167 may comprise insulating and conductive material, for example, and may provide isolation between electrical components mounted on the package 167.

The stereo speakers 170 may comprise a pair of speakers that may be operable to generate audio signals from electrical signals received from the CODEC 172. The HAC coil 174 may comprise suitable circuitry, logic, and/or code that may enable communication between the wireless device 150 and a T-coil in a hearing aid, for example. In this manner, electrical audio signals may be communicated to a user that utilizes a hearing aid, without the need for generating sound signals via a speaker, such as the stereo speakers 170, and converting the generated sound signals back to electrical signals in a hearing aid, and subsequently back into amplified sound signals in the user's ear, for example.

The dual digital microphone 176 may comprise suitable circuitry, logic, interface(s), and/or code that may be operable to detect sound waves and convert them to electrical signals. The electrical signals generated by the dual digital microphone 176 may comprise digital signals, and thus may not require analog to digital conversion prior to digital processing in the CODEC 172. The dual digital microphone 176 may enable beamforming capabilities, for example.

The vibration transducer 178 may comprise suitable circuitry, logic, interface(s), and/or code that may enable notification of an incoming call, alerts and/or message to the wireless device 150 without the use of sound. The vibration transducer may generate vibrations that may be in synch with, for example, audio signals such as speech or music.

In operation, control and/or data information, which may comprise the programmable parameters, may be transferred from other portions of the wireless device 150, not shown in FIG. 1, to the processor 156. Similarly, the processor 156 may be enabled to transfer control and/or data information, which may include the programmable parameters, to other portions of the wireless device 150, not shown in FIG. 1, which may be part of the wireless device 150.

The processor 156 may utilize the received control and/or data information, which may comprise the programmable parameters, to determine an operating mode of the transceiver 152. For example, the processor 156 may be utilized to select a specific frequency for a local oscillator, a specific gain for a variable gain amplifier, configure the local oscillator and/or configure the variable gain amplifier for operation in accordance with various embodiments of the invention. Moreover, the specific frequency selected and/or parameters needed to calculate the specific frequency, and/or the specific gain value and/or the parameters, which may be utilized to calculate the specific gain, may be stored in the system memory 158 via the processor 156, for example. The information stored in system memory 158 may be transferred to the transceiver 152 from the system memory 158 via the processor 156.

The CODEC 172 in the wireless device 150 may communicate with the processor 156 in order to transfer audio data and control signals. Control registers for the CODEC 172 may reside within the processor 156. The processor 156 may exchange audio signals and control information via the system memory 158. The CODEC 172 may up-convert and/or down-convert the frequencies of multiple audio sources for processing at a desired sampling rate.

The leaky wave antennas 164A, 164B, and/or 164C may be configured to generate a high frequency signal from a plurality of lower frequency signals, each with an appropriate phase difference such that the transitions in each signal may represent a transition for the higher frequency signal. The resonant cavity of the leaky wave antennas 164A, 164B, and/or 164C may enable the constructive summation of the plurality of received signals. In this manner, the transceiver 152, and therefore the wireless device 150, may be operable to transmit high frequency signals, 60 GHz, for example, while operating at lower frequencies within the wireless device 150.

Figure 2:
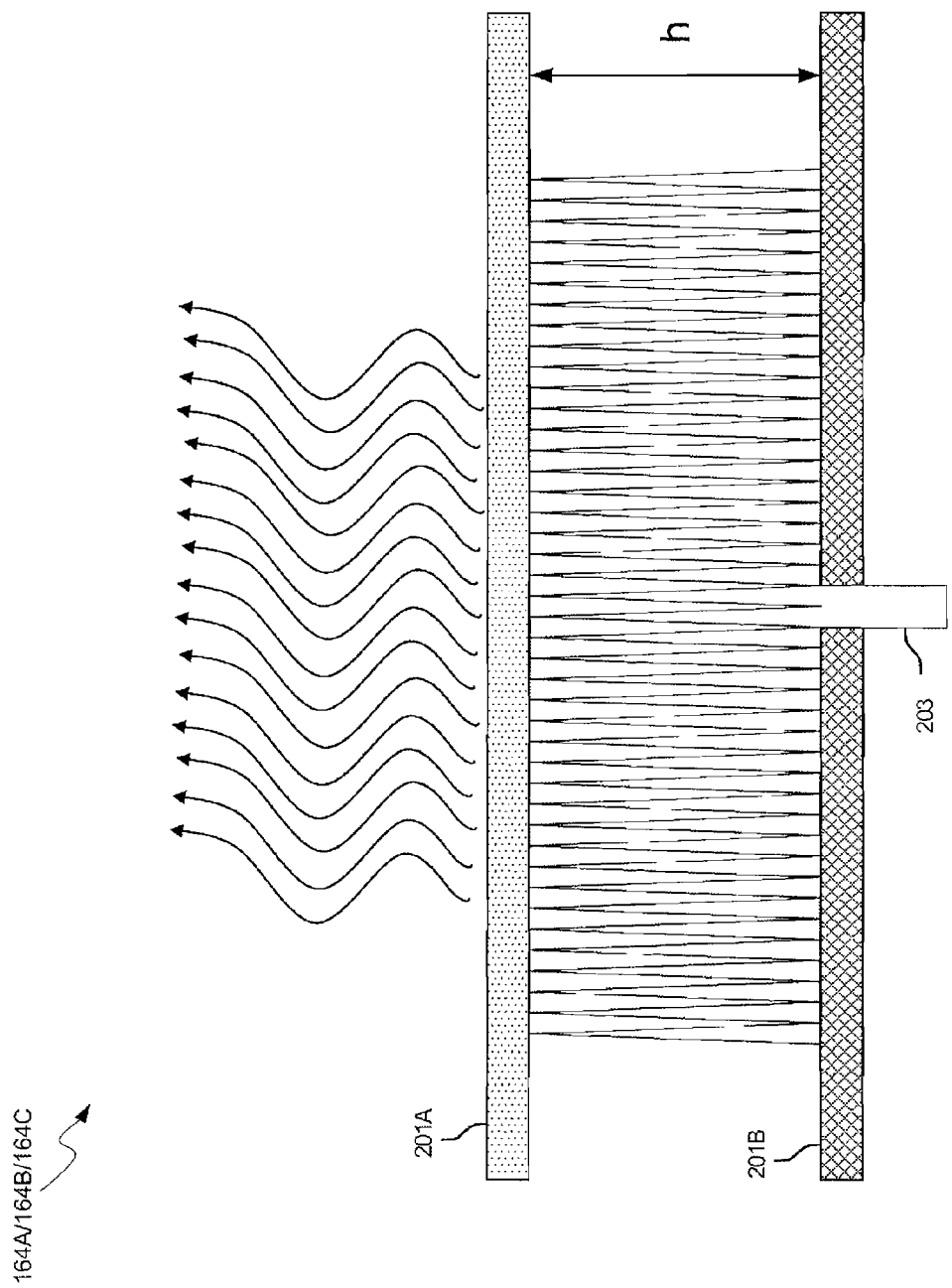
FIG. 2 is a block diagram illustrating an exemplary leaky wave antenna, in accordance with an embodiment of the invention.

FIG. 2 is a block diagram illustrating an exemplary leaky wave antenna, in accordance with an embodiment of the invention. Referring to FIG. 2, there is shown the leaky wave antenna 164A, 164B, and/or 164C comprising a partially reflective surface 201A, a reflective surface 201B, and a feed point 203. The space between the partially reflective surface 201A and the reflective surface 201B may be filled with dielectric material, for example, and the height, h, between the partially reflective surface 201A and the reflective surface 201B may be utilized to configure the frequency of transmission of the leaky wave antenna 164A, 164B, and/or 164C.

The feed point 203 may comprise an input terminal for applying an input voltage to the leaky wave antenna 164A, 164B, and/or 164D. The invention is not limited to a single feed point 203, as there may be any amount of feed points for different phases of signal, for example, to be applied to the leaky wave antenna 164A, 164B, and/or 164C.

In an embodiment of the invention, the height, h, may be one-half the wavelength of the desired transmitted mode from the leaky wave antenna 164A, 164B, and/or 164C. In this manner, the phase of an electromagnetic mode that traverses the cavity twice may be coherent with the input signal at the feed point 203, thereby configuring a resonant cavity known as a Fabry-Perot cavity. The magnitude of the resonant mode may decay exponentially in the lateral direction from the feed point 203, thereby reducing or eliminating the need for confinement structures to the sides of the leaky wave antenna 164A, 164B, and/or 164C. The input impedance of the leaky wave antenna 164A, 164B, and/or 164C may be configured by the vertical placement of the feed point 203, as described further in FIG. 6.

In operation, a signal to be transmitted via a power amplifier may be communicated to the feed point 203 of the leaky wave antennas 164A, 164B, and/or 164C with a frequency f. The cavity height, h, may be configured to correlate to one half the wavelength of a harmonic of the signal of frequency f. The signal may traverse the height of the cavity and may be reflected by the partially reflective surface 201A, and then traverse the height back to the reflective surface 201B. Since the wave will have travelled a distance corresponding to a full wavelength, constructive interference may result and a resonant mode may thereby be established.

Leaky wave antennas may enable the configuration of high gain antennas without the need for a large array of antennas which require a complex feed network and suffer from loss due to feed lines. The leaky wave antennas 164A, 164B, and/or 164C may be integrated on or in a chip, package, or printed circuit board. Signals may be amplified by a plurality of power amplifiers, which may comprise switching power amplifiers, thereby generating a plurality of square waves communicated to the leaky wave antennas 164A, 164B, and/or 164C. The leaky wave antennas 164A, 164B, and/or 164C may be operable to transmit a signal at a higher frequency than the received signals by summing a plurality of square wave signals, each with an appropriate phase difference to allow the transitions of each signal to represent a higher frequency signal when summed by the resonant cavity of the leaky wave antennas 164A, 164B, and/or 164C.

Figure 3:
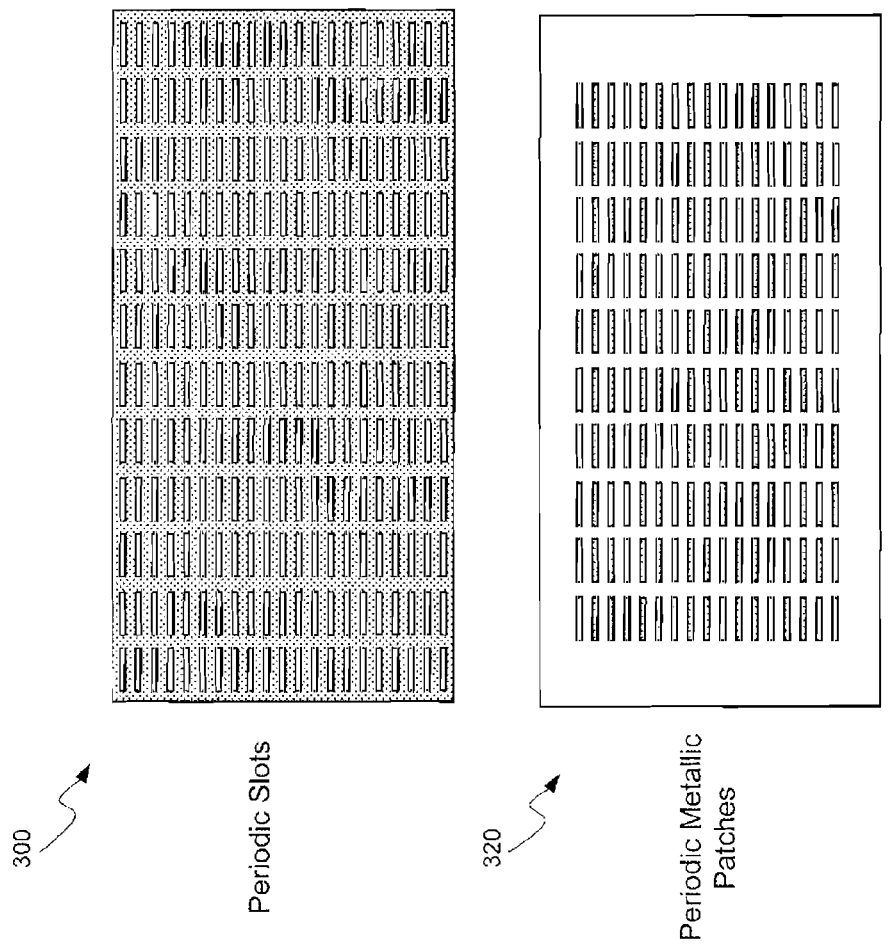
FIG. 3 is a block diagram illustrating a plan view of exemplary partially reflective surfaces, in accordance with an embodiment of the invention.

FIG. 3 is a block diagram illustrating a plan view of exemplary partially reflective surfaces, in accordance with an embodiment of the invention. Referring to FIG. 3, there is shown a partially reflective surface 300 comprising periodic slots in a metal surface, and a partially reflective surface 320 comprising periodic metal patches. The partially reflective surfaces 300/320 may comprise different embodiments of the partially reflective surface 201A described with respect to FIG. 2.

The spacing, dimensions, shape, and orientation of the slots and/or patches in the partially reflective surfaces 300/320 may be utilized to configure the bandwidth, and thus Q-factor, of the resonant cavity defined by the partially reflective surfaces 300/320 and a reflective surface, such as the reflective surface 201B, described with respect to FIG. 2. The partially reflective surfaces 300/320 may thus comprise frequency selective surfaces due to the narrow bandwidth of signals that may leak out of the structure as configured by the slots and/or patches.

The spacing between the patches and/or slots may be related to wavelength of the signal transmitted and/or received, which may be somewhat similar to beamforming with multiple antennas. The length of the slots and/or patches may be several times larger than the wavelength of the transmitted and/or received signal or less, for example, since the leakage from the slots and/or regions surround the patches may add up, similar to beamforming with multiple antennas.

In an embodiment of the invention, the slots/patches may be configured via micro-electromechanical system (MEMS) switches to tune the Q of the resonant cavity.

Figure 4:
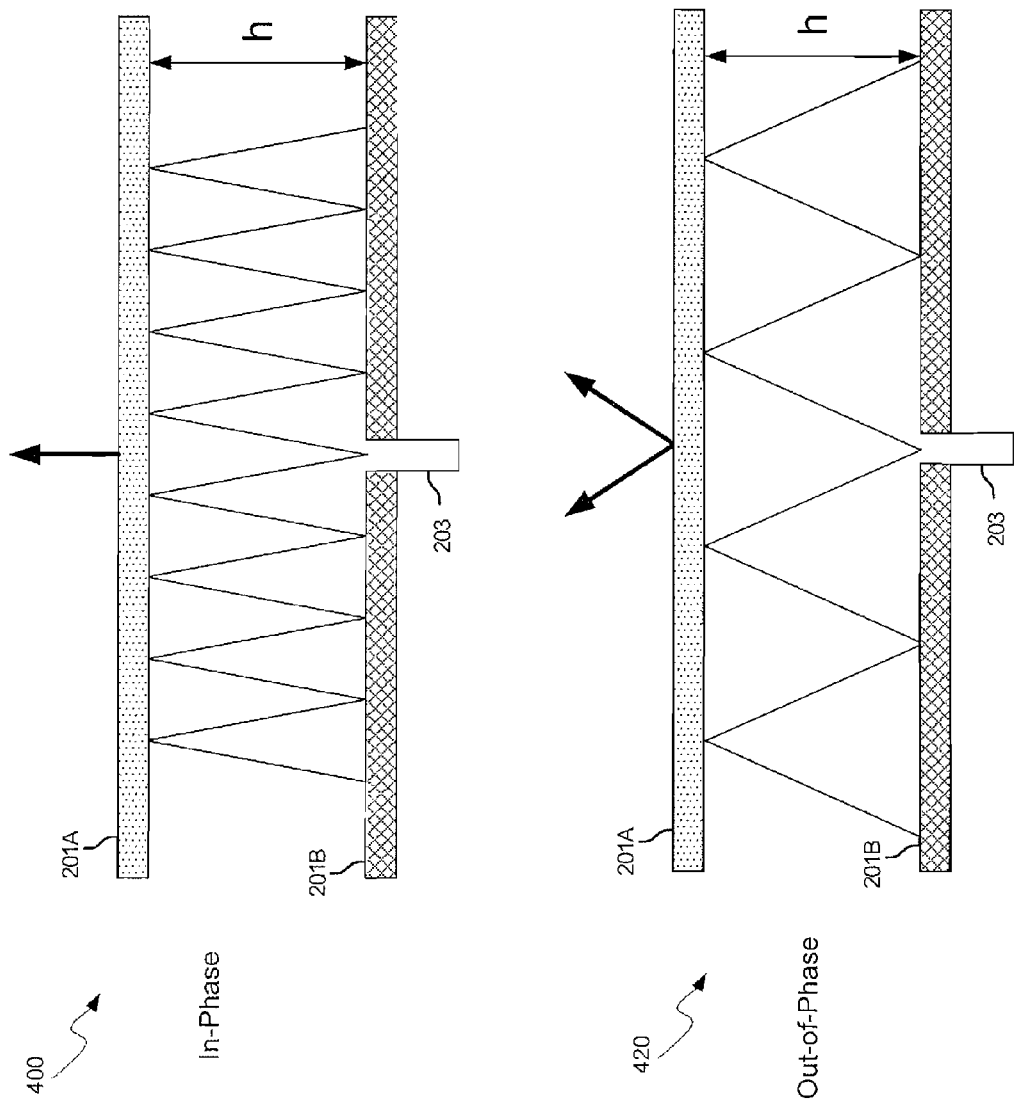
FIG. 4 is a block diagram illustrating an exemplary phase dependence of a leaky wave antenna, in accordance with an embodiment of the invention.

FIG. 4 is a block diagram illustrating an exemplary phase dependence of a leaky wave antenna, in accordance with an embodiment of the invention. Referring to FIG. 4, there is shown a leaky wave antenna comprising the partial reflective surface 201A, the reflective surface 201B, and the feed point 203. In-phase condition 400 illustrates the relative beam shape transmitted by the leaky wave antenna 164A, 164B, and/or 164C when the frequency of the signal communicated to the feed point 203 matches that of the resonant cavity as defined by the cavity height, h, and the dielectric constant of the material between the reflective surfaces.

Similarly, out-of-phase condition 420 illustrates the relative beam shape transmitted by the leaky wave antenna 164A, 164B, and/or 164C when the frequency of the signal communicated to the feed point 203 does not match that of the resonant cavity. The resulting beam shape may be conical, as opposed to a single main vertical node. These are illustrated further with respect to FIG. 5.

Figure 5:
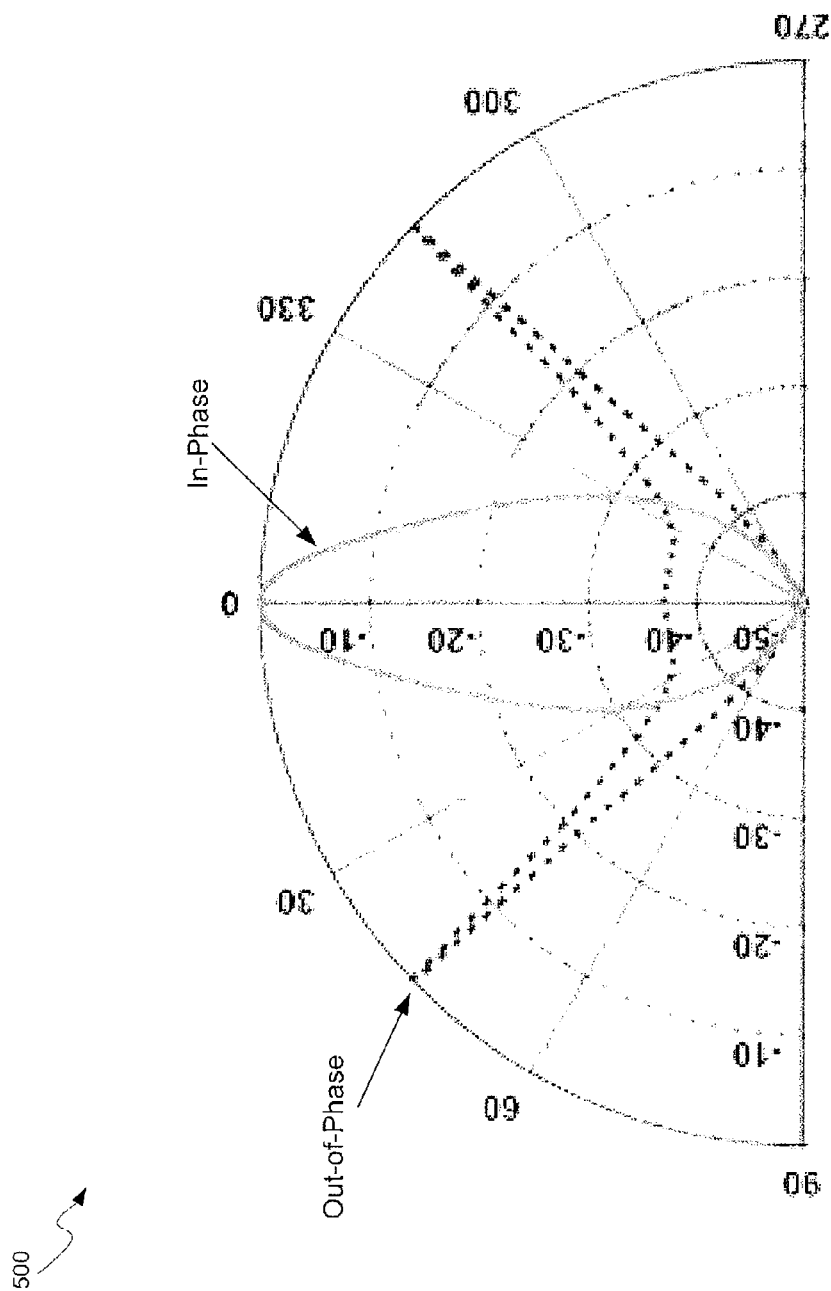
FIG. 5 is a block diagram illustrating exemplary in-phase and out-of-phase beam shapes for a leaky wave antenna, in accordance with an embodiment of the invention.

FIG. 5 is a block diagram illustrating exemplary in-phase and out-of-phase beam shapes for a leaky wave antenna, in accordance with an embodiment of the invention. Referring to FIG. 5, there is shown a plot 500 of transmitted signal beam shape versus angle for the in-phase and out-of-phase conditions for a leaky wave antenna.

The In-phase curve in the plot 500 may correlate to the case where the frequency of the signal communicated to a leaky wave antenna matches the resonant frequency of the cavity. In this manner, a single vertical main node may result. In instances where the frequency of the signal at the feed point is not at the resonant frequency, a double, or conical-shaped node may be generated as shown by the Out-of-phase curve in the plot 500.

Figure 6:
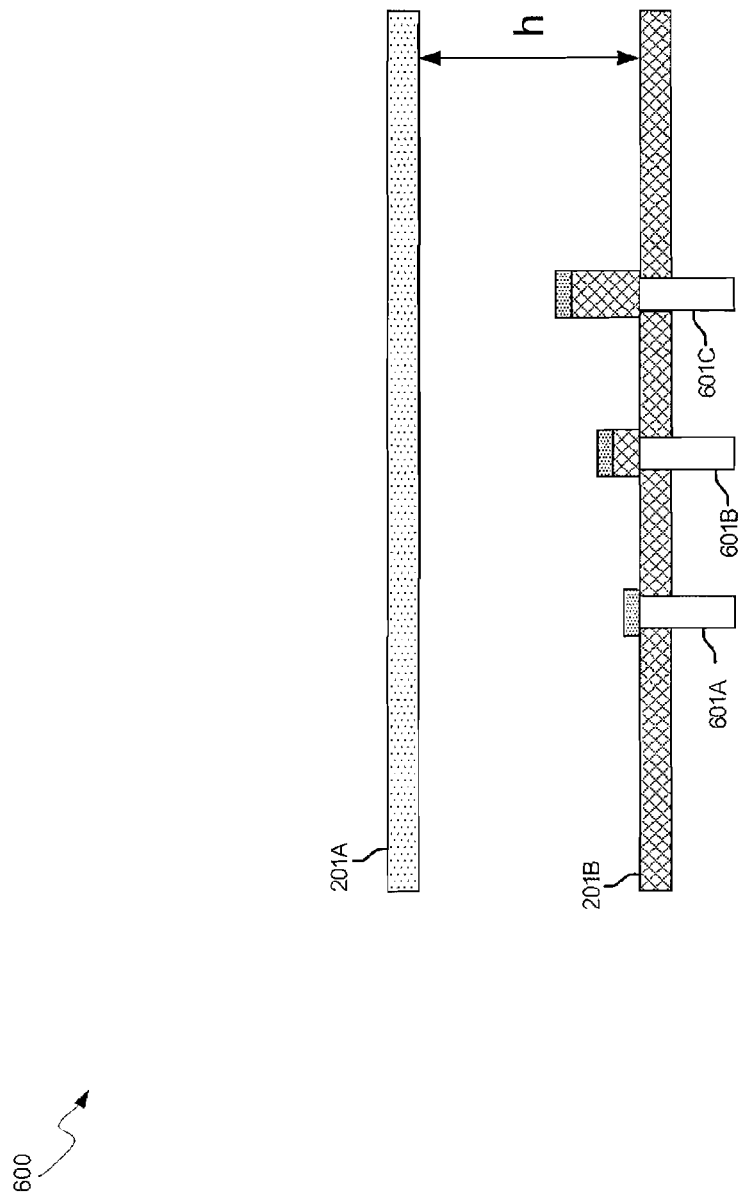
FIG. 6 is a block diagram illustrating a leaky wave antenna with variable input impedance feed points, in accordance with an embodiment of the invention.

FIG. 6 is a block diagram illustrating a leaky wave antenna with variable input impedance feed points, in accordance with an embodiment of the invention. Referring to FIG. 6, there is shown a leaky wave antenna 600 comprising the partially reflective surface 201A and the reflective surface 201B. There is also shown feed points 601A-601C. The feed points 601A-601C may be located at different positions along the height, h, of the cavity thereby configuring different impedance points for the leaky wave antenna.

In this manner, a leaky wave antenna may be coupled to a plurality of power amplifiers with varying output impedances. For example, where power amplifiers and phase shifters for generating a plurality of signals to be combined and transmitted by the leaky wave antenna 600 comprise different impedances, an appropriate feed point with matching input impedance may be utilized.

Figure 7:
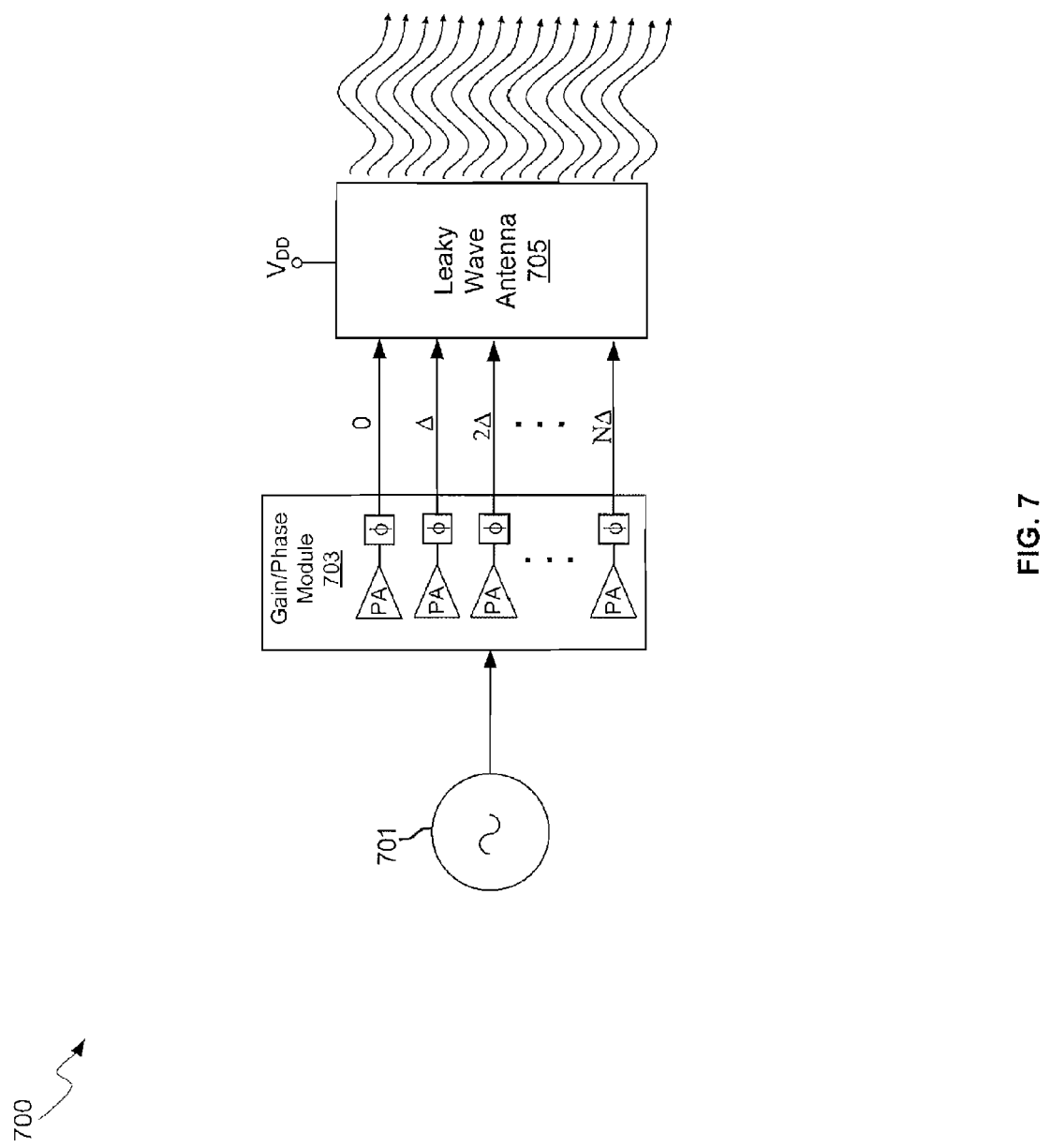
FIG. 7 is a block diagram of multiple input signals to a leaky wave antenna, in accordance with an embodiment of the invention.

FIG. 7 is a block diagram of multiple input signals to a leaky wave antenna, in accordance with an embodiment of the invention. Referring to FIG. 7, there is shown a signal source 701, a gain and phase module 703, and a leaky wave antenna 705. The leaky wave antenna 705 may be substantially similar to the leaky wave antennas 164A, 164B, 164C, and/or 600.

The signal source 701 may comprise suitable circuitry, logic, interfaces, and/or code that may be operable to generate a source signal. The signal source 701 may comprise a voltage-controlled oscillator (VCO), for example, that may communicate a signal at a desired frequency to the gain and phase module 703. In another embodiment of the invention, the signal source 701 may comprise a plurality of signal sources, such as VCOs, that may be operable to communicate a plurality of signals to the gain and phase module 703.

The gain and phase module 703 may comprise suitable circuitry, logic, interfaces, and/or code that may be operable to apply gain and phase shift to received source signals. In this manner, a plurality of output signals, which are separated by a phase shift Δ, may be generated. The number of signals that are generated may be dependent on the desired frequency. For example, a doubling of the frequency of a signal received from the signal source 701 may be enabled by utilizing two output signals of the gain and phase module 703 with an appropriate phase difference, 90 degrees for example.

The gain stages of the gain and phase module 703 may comprise a plurality of power amplifiers, PA. The PAs may be operated in switching mode, thereby generating square wave signals from a received input signal. The phase difference in output signals may be configured by a plurality of phase offset modules, ϕ.

In operation, a source signal may be communicated from the signal source 701 to the gain and phase module 703. In an exemplary embodiment of the invention, the gain and phase module 703 may generate a plurality of output signals comprising square wave signals, which may be separated by a phase difference, Δ. The gain and phase module 703 may generate square waves from a sine wave input utilizing a plurality of PAs, PA, operating in switch mode. Alternatively, the signal source 701 may generate a square wave directly.

The phase difference, Δ, may be configured to generate a higher frequency signal from a lower frequency input signal generated by the signal source 701. For example, three input signals with phase angles of 0, 60, and 120 degrees may result in a 3× frequency signal transmitted by the leaky wave antenna 705. The phase difference may be configured by the phase modules, ϕ, in the gain and phase module 703, which may generate a plurality of output signals from a single signal, or may receive a plurality of input signals from the signal source 70. In this manner, a 60 GHz signal may be generated from one 20 GHz signal split into three signals of different phase or three signals with different phases.

In addition, the amplitude of the signal transmitted by the leaky wave antenna 705 may be modulated by modulating the voltage, $V_{DD}$, applied to the leaky wave antenna 705.

Figure 8:
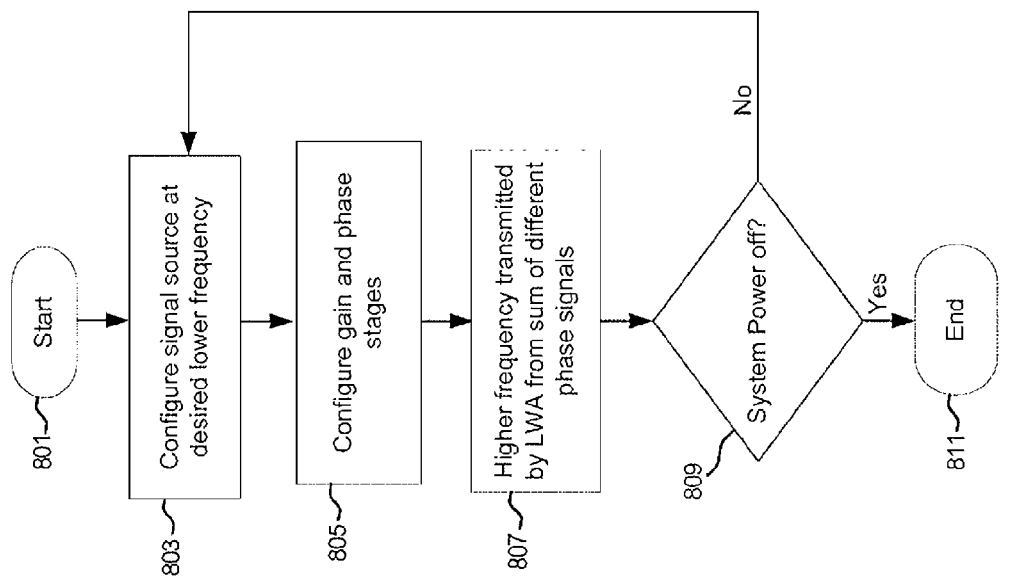
FIG. 8 is a block diagram illustrating exemplary steps for an n-phase transmitter utilizing a leaky wave antenna, in accordance with an embodiment of the invention.

FIG. 8 is a block diagram illustrating exemplary steps for an n-phase transmitter utilizing a leaky wave antenna, in accordance with an embodiment of the invention. Referring to FIG. 8, in step 803 after start step 801, a signal source may be configured to generate a signal at a frequency lower than a desired frequency. In step 805, gain and phase stages may be configured to generate a plurality of square wave signals separated by a phase difference, D. In step 807, a higher frequency may be transmitted by a leaky wave antenna that is the sum of the plurality of signals communicated to the leaky wave antenna with different phases. If, in step 809, the wireless device 150 is to be powered down, the exemplary steps may proceed to end step 811. In instances when the wireless device 150 is not to be powered down, the exemplary steps may proceed back to step 803 to configure the signal source at a desired frequency.

In an embodiment of the invention, a method and system are disclosed for transmitting an n-phase wireless signal at a first frequency via a leaky wave antenna 164A, 164B, 164C, 600, and/or 705 in a wireless device 150 utilizing a plurality of second frequency signals from one or more signal sources 701, wherein the second frequency may be lower than the first frequency. Each of the plurality of lower frequency signals may be configured with a phase difference, Δ, to generate the higher frequency signal. The plurality of lower frequency signals may be communicated to the one or more leaky wave antennas 164A, 164B, 1640, 600, and/or 705 utilizing one or more power amplifiers. The one or more power amplifiers, PA, may be operated in switching mode. A square wave may be generated from the source signal utilizing the one or more power amplifiers, PA, operating in the switching mode. The one or more leaky wave antennas 164A, 164B, 164C, 600, and/or 705 may be integrated on the chip 162, on a package 167 to which the chip 162 is affixed, and/or on a printed circuit board 171 to which the chip 162 is affixed. A plurality of square wave signals may be generated utilizing the one or more signal sources 701. The transmitted wireless signal may be amplitude modulated utilizing a bias voltage, $V_{DD}$, applied to the one or more leaky wave antennas 164A, 164B, 164C, 600, and/or 705.

Another embodiment of the invention may provide a machine and/or computer readable storage and/or medium, having stored thereon, a machine code and/or a computer program having at least one code section executable by a machine and/or a computer, thereby causing the machine and/or computer to perform the steps as described herein for an n-phase transmitter utilizing a leaky wave antenna.

Accordingly, aspects of the invention may be realized in hardware, software, firmware or a combination thereof. The invention may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present invention may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present invention may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present invention.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A wireless device comprising:
   a circuit communicatively coupled to a leaky wave antenna, said circuit being operable to:
   transmit an n-phase wireless signal at a first frequency via said leaky wave antenna utilizing a generated signal of a second frequency, wherein said second frequency is less than said first frequency.

2. The wireless device of claim 1, wherein said generated signal is produced by a signal source in said wireless device.

3. The wireless device of claim 2, wherein said circuit is operable to generate a square wave from said signal source utilizing a power amplifier.

4. The wireless device of claim 3, wherein said circuit operates said power amplifier in a switching mode.

5. The wireless device of claim 1, wherein said circuit is operable to communicate said generated signal to said leaky wave antenna utilizing a power amplifier.

6. The wireless device of claim 5, wherein said circuit operates said power amplifier in a switching mode.

7. The wireless device of claim 1, wherein said leaky wave antenna is integrated in a chip in said wireless device.

8. The wireless device of claim 7, wherein said leaky wave antenna is integrated on a printed circuit board to which said chip is affixed.

9. The wireless device of claim 7, wherein said generated signal is produced by a signal source in said wireless device.

10. The wireless device of claim 7, wherein said circuit is operable to communicate said generated signal to said leaky wave antenna utilizing a power amplifier.

11. The wireless device of claim 10, wherein said circuit operates said power amplifier in a switching mode.

12. The wireless device of claim 7, wherein said circuit is operable to generate a square wave from said signal source utilizing a power amplifier.

13. The wireless device of claim 12, wherein said circuit operates said power amplifier in a switching mode.

14. The wireless device of claim 7, wherein said circuit is operable to amplitude modulate said n-phase wireless signal utilizing a bias voltage applied to said leaky wave antenna.

15. The wireless device of claim 1, wherein said leaky wave antenna is integrated on a package in which a chip is affixed.

16. The wireless device of claim 15, wherein said generated signal is produced by a signal source in said wireless device.

17. The wireless device of claim 15, wherein said circuit is operable to communicate said generated signal to said leaky wave antenna utilizing a power amplifier.

18. The wireless device of claim 17, wherein said circuit operates said power amplifier in a switching mode.

19. The wireless device of claim 15, wherein said circuit is operable to amplitude modulate said n-phase wireless signal utilizing a bias voltage applied to said leaky wave antenna.

20. The wireless device of claim 1, wherein said circuit is operable to amplitude modulate said n-phase wireless signal utilizing a bias voltage applied to said leaky wave antenna.

* * * * *